United States Patent
Cress et al.

(10) Patent No.: US 10,641,233 B2
(45) Date of Patent: May 5, 2020

(54) RESONANCE BOOSTED IGNITION VOLTAGE

(71) Applicant: Caterpillar Inc., Deerfield, IL (US)

(72) Inventors: James Cress, West Lafayette, IN (US); Andrew Neaville, Mt. Pulaski, IL (US)

(73) Assignee: Caterpillar Inc., Peoria, IL (US)

(*) Notice: Subject to any disclaimer, the term of this patent is extended or adjusted under 35 U.S.C. 154(b) by 0 days.

(21) Appl. No.: 16/150,755

(22) Filed: Oct. 3, 2018

(65) Prior Publication Data

US 2020/0109692 A1   Apr. 9, 2020

(51) Int. Cl.

| F02P 3/05 | (2006.01) |
|---|---|
| F02P 9/00 | (2006.01) |
| F02P 17/12 | (2006.01) |
| G01R 19/165 | (2006.01) |
| F02D 41/20 | (2006.01) |
| H01T 13/40 | (2006.01) |

(52) U.S. Cl.
CPC ............. *F02P 9/002* (2013.01); *F02D 41/20* (2013.01); *F02P 3/05* (2013.01); *F02P 17/12* (2013.01); *G01R 19/16528* (2013.01); *H01T 13/40* (2013.01); *F02D 2041/2013* (2013.01); *F02D 2041/2051* (2013.01)

(58) Field of Classification Search
CPC .... F02P 9/002; F02P 17/12; F02P 3/05; F02D 41/20; F02D 2041/2013; F02D 2041/2051; H01T 13/40; G01R 19/16528
USPC ........ 123/605, 618, 620, 623, 636; 701/102, 701/111; 73/114.62, 114.63
See application file for complete search history.

(56) References Cited

U.S. PATENT DOCUMENTS

| 6,020,742 | A | 2/2000 | Kano et al. |
| 6,701,904 | B2 | 3/2004 | Lepley |
| 7,401,603 | B1 | 7/2008 | Lepley |
| 8,973,561 | B2 * | 3/2015 | Ruan ...................... F02P 23/04 123/143 B |
| 2006/0021607 | A1 | 2/2006 | Toriyama |
| 2013/0206123 | A1 | 8/2013 | Dirumdam et al. |
| 2018/0100479 | A1 | 4/2018 | Shah et al. |

FOREIGN PATENT DOCUMENTS

DE   102016202601 A1   8/2017

* cited by examiner

*Primary Examiner* — Hai H Huynh
(74) *Attorney, Agent, or Firm* — Harrity & Harrity LLP

(57) ABSTRACT

A device may determine a timing configuration for an ignition system. The device may pulse a driver to apply a set of resonant voltage pulses to the ignition system. The set of resonant voltage pulses may cause a set of increasing peak voltages. At least one peak voltage, of the set of increasing peak voltages, may satisfy a threshold to cause a spark in a spark plug of the ignition system.

20 Claims, 4 Drawing Sheets

RESONANCE BOOSTED IGNITION VOLTAGE

TECHNICAL FIELD

The present disclosure relates generally to control for an ignition system and, more particularly, to a resonance boosted ignition voltage for a spark plug in a high power natural gas engine.

BACKGROUND

A machine may include a transmission coupled to a power source, such as a natural gas engine, to enable the machine to be repositioned and/or to travel between locations. For example, natural gas engines, such as high power natural gas engines, may be used in a pumping station, a genset, a generator, a drilling machine, a vehicle, a backhoe loader, a cold planer, a wheel loader, a compactor, a feller buncher, a forest machine, a forwarder, a harvester, an excavator, an industrial loader, a knuckleboom loader, a material handler, a motor grader, a pipelayer, a road reclaimer, a skid steer loader, a skidder, a telehandler, a tractor, a dozer, a tractor scraper, or other equipment.

The power source may include an ignition system and an engine control system, such as an engine control module (ECM), that is configured to control a voltage provided to a spark plug. The engine control system may cause a driver of the ignition system to provide a current to a coil of the spark plug. Based on providing the current to the coil, the engine control system may cause a voltage to develop in electrodes of the spark plug. When the voltage satisfies a threshold value, such as a dielectric strength of a gas forming a gap between the electrodes, current may flow across the gap causing a spark, which may enable the natural gas engine to combust natural gas in a combustion chamber of the natural gas engine. However, as wear occurs to the electrodes of the spark plug, the gap between the electrodes may increase, which may result in a higher voltage being required to cause the spark. As a result, spark plugs may need to be replaced after a particular period of time as a result of an inability to achieve a sufficient voltage to cause the spark.

One attempt to improve ignition systems is disclosed in United States Patent Application Publication No. 2013/0206123 that was filed by MAN Diesel & Turbo SE on Jan. 16, 2013 ("the '123 patent publication"). In particular, the '123 patent publication discloses a voltage converter constructed to "convert a voltage applied to [ ] primary terminals into a higher voltage." The ignition system, disclosed in the '123 patent publication, includes an electrical capacitance to deliver charge to primary terminals of a voltage converter over a specific discharge time.

However, controlling a discharge time and/or other parameters and converting a voltage to a higher voltage may not result in achieving a threshold voltage for causing a spark as wear on the electrodes increases. An engine control system, of the present disclosure, configured to cause a resonance boosted ignition voltage solves one or more problems set forth above and/or other problems in the art.

SUMMARY

According to some implementations, the present disclosure is related to a machine. The machine may include a natural gas engine. The machine may include an ignition system. The machine may include one or more processors configured to cause a first current to be provided to a coil of the ignition system, wherein the first current is configured to cause a first voltage that does not satisfy a threshold voltage to cause a spark in a spark plug of the ignition system. The one or more processors may be configured to cause, after a gap period, a second current to be provided to the coil of the ignition system to cause the spark in the spark plug of the ignition system, wherein the gap period is configured to cause a resonant effect on the first voltage, and wherein the second current is configured to cause a second voltage that satisfies the threshold voltage based on the resonant effect on the first voltage.

According to some implementations, the present disclosure is related to a method. The method may include determining, by a processor, a timing configuration for an ignition system. The method may include pulsing, by the processor, a driver to apply a set of resonant voltage pulses to the ignition system, wherein the set of resonant voltage pulses cause a set of increasing peak voltages, and wherein at least one peak voltage, of the set of increasing peak voltages, satisfies a threshold to cause a spark in a spark plug of the ignition system.

According to some implementations, the present disclosure is related to an engine control system. The engine control system may include a memory and one or more processors. The one or more processors may be configured to cause a first current to be provided to a coil of an ignition system of an engine at a first time selected based on a first state of the engine, wherein the first current is configured to cause a first voltage that does not satisfy a threshold voltage to cause a spark in a spark plug of the ignition system. The one or more processors may be configured to cause, after a gap period and at a second time selected based on a second state of the engine and a configuration parameter relating to the first voltage, a second current to be provided to the coil of the ignition system to cause the spark in the spark plug of the ignition system, wherein the gap period is configured to cause a resonant effect on the first voltage, and wherein the second current is configured to cause a second voltage that satisfies the threshold voltage based on the resonant effect on the first voltage.

DETAILED DESCRIPTION

This disclosure relates to an engine control system to provide a resonance boosted ignition voltage for an ignition system of a natural gas engine. The engine control system has universal applicability to any machine utilizing such an engine control system. The term "machine" may refer to any machine that performs an operation associated with an industry such as, for example, mining, construction, farming, transportation, or any other industry. As some examples, the machine may be a pumping station, a genset, a generator, a vehicle, a backhoe loader, a cold planer, a wheel loader, a compactor, a feller buncher, a forest machine, a forwarder, a harvester, an excavator, an industrial loader, a knuckleboom loader, a material handler, a motor grader, a pipelayer, a road reclaimer, a skid steer loader, a skidder, a telehandler, a tractor, a dozer, a tractor scraper, and/or the like. Moreover, one or more implements may be connected to the machine and controlled using a natural gas engine associated with the engine control system described herein. Although some aspects, described herein, are described in terms of a mobile machine (e.g., a track type tractor), aspects described herein may be used with another type of machine, such as a static machine (e.g., a pumping station, a genset, a generator, and/or the like).

Figure 1:
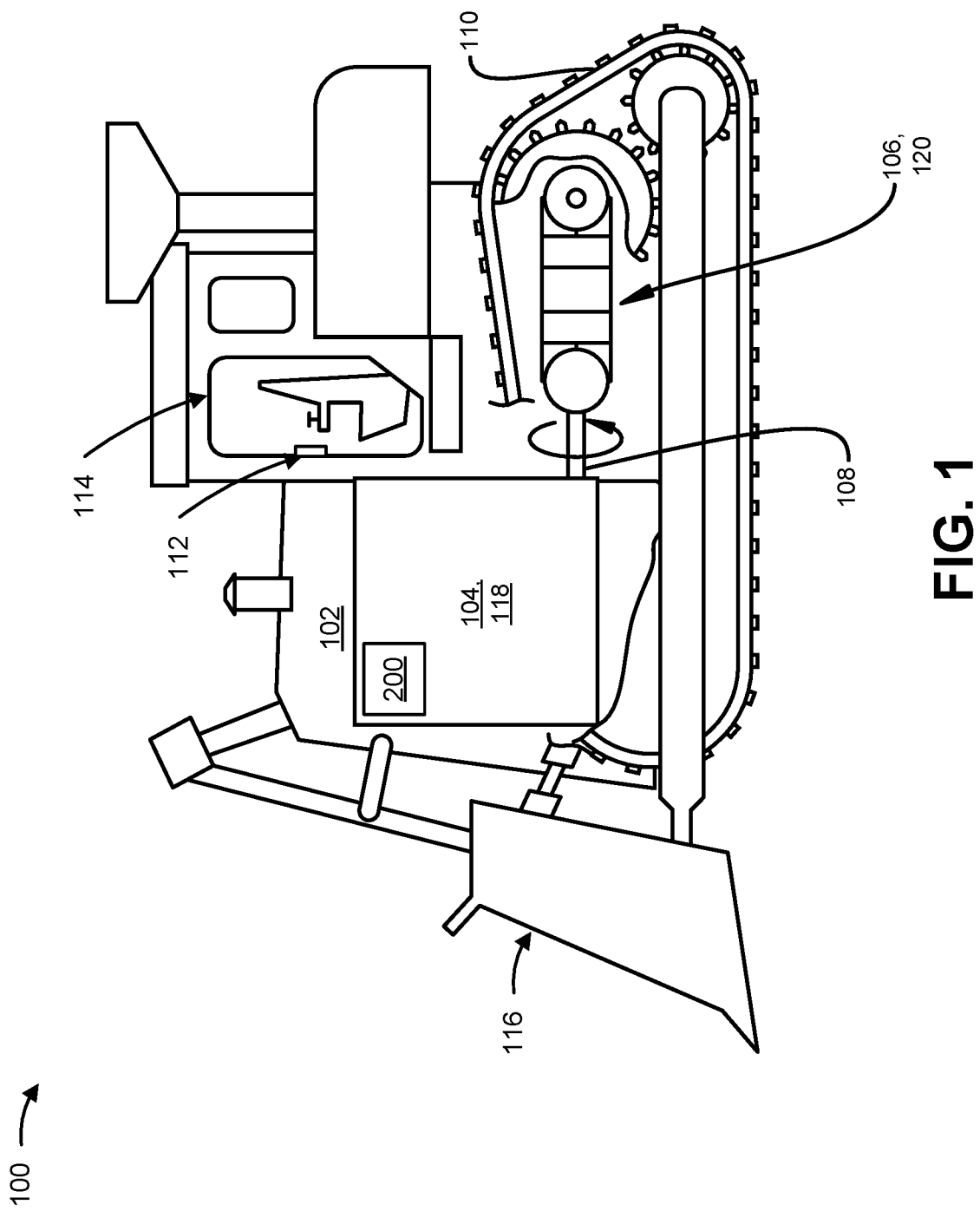
FIG. 1 is a diagram of an example machine that includes an engine control system.

FIG. 1 is a diagram of an example machine 100 that includes an engine control system. The machine 100 is shown as a track type tractor but may include any type of machine that includes an engine control system capable of controlling a natural gas engine of machine 100.

As shown, the machine 100 may have a frame 102 that supports a power source 104, a drive system 106, a drive shaft 108, and a traction system 110. The power source 104 is configured to supply power to the machine 100. In some implementations, the power source 104 may be a natural gas engine, such as a high power natural gas engine and/or the like. The power source 104 may be operably arranged to receive control signals from operator controls 112 in operator station 114. Additionally, the power source 104 may be operably arranged with the drive system 106 and/or an implement 116 to selectively operate the drive system 106 and/or the implement 116 according to control signals received from the operator controls 112. The power source 104 may provide operating power for the propulsion of the drive system 106 and/or the operation of the implement 116 via, for example, the drive system 106, the drive shaft 108, and/or the like.

The drive system 106 may be operably arranged with the power source 104 to selectively propel the machine 100 via control signals from the operator controls 112. The drive system 106 may be operably connected to a plurality of ground-engaging members, such as traction system 110, as shown, which may be movably connected to the machine 100 and the frame 102 through axles, drive shafts, a transmission, and/or other components and which may be movably connected to the power source 104 and drive system 106 via the drive shaft 108. In some implementations, the traction system 110 may be provided in the form of a track-drive system, a wheel-drive system, or any other type of drive system configured to propel the machine 100. In some implementations, the drive system 106 may be operably arranged with the power source 104 to selectively operate the implement 116, which may be movably connected to the machine 100, the frame 102, and the drive system 106.

In some implementations, the power source 104 and the drive system 106 may include an engine 118 and a transmission 120, respectively. The engine 118 may be any type of engine suitable for performing work using the machine 100, such as an internal combustion engine, a diesel engine, a gasoline engine, a gaseous fuel-powered engine, a natural gas engine, a high power natural gas engine, and/or the like. The transmission 120 may transfer power from the engine 118 to the traction system 110 and/or the implement 116. The transmission 120 may provide a number of gear ratios that enable the machine 100 to travel at a relatively wide range of speeds and/or conditions via the traction system 110, and/or that enable the use of the implement 116 to perform work. In some implementations, the engine control system 200 may control an ignition system of the engine 118 to cause a threshold voltage to be provided to a spark plug of the ignition system to case a spark for the engine 118. For example, in a pumping station type of machine, the ignition system may enable engine 118 to operate pumping implements. Similarly, in a genset type of machine, the ignition system may enable engine 118 to be used as a generator to generate power.

The implement 116 may be operably arranged with the drive system 106 such that the implement 116 is movable through control signals transmitted from the operator controls 112 to the drive system 106, the drive shaft 108, and/or the like. The illustrated implement 116 is a tractor loader. Other embodiments can include any other suitable implement for a variety of tasks, such as, for example, dozing, blading, brushing, compacting, grading, lifting, ripping, plowing, and/or the like. Example implements include dozers, augers, buckets, breakers/hammers, brushes, compactors, cutters, forked lifting devices, grader bits and end bits, grapples, and/or the like.

As indicated above, FIG. 1 is provided as an example. Other examples are possible and may differ from what was described in connection with FIG. 1.

Figure 2:
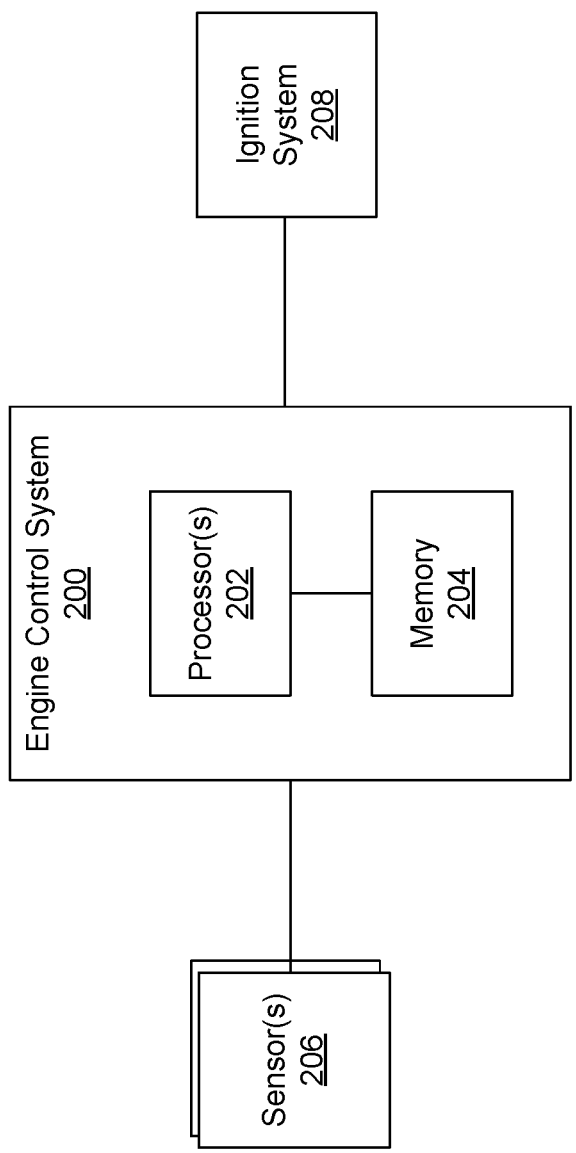
FIG. 2 is a diagram of an example engine control system that may be used with the machine of FIG. 1.

FIG. 2 is a diagram of an example engine control system 200 and associated components that may interact with the engine control system 200.

The engine control system 200 includes one or more processors 202. Processor 202 is implemented in hardware, firmware, or a combination of hardware and software. Processor 202 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 202 includes one or more processors capable of being programmed to perform a function. Memory 204 includes a random access memory (RAM), a read only memory (ROM), and/or another type of dynamic or static storage device (e.g., a flash memory, a magnetic memory, and/or an optical memory) that stores information and/or instructions for use by processor 202.

In some implementations, the engine control system 200 may be an electronic control unit (ECU), an electronic control module (ECM), a controller, and/or the like of the machine 100 and/or the engine 118. The processor 202 may execute one or more instructions and/or commands, such as based on measurement information from a sensor 206, to control one or more components of machine 100, such as to control operation of an ignition system 208, the engine 118, and/or the like. The memory 204 may store program code for execution by the processor 202 and/or for storing data in connection with execution of such program code by the processor 202.

The engine control system 200 may receive one or more input signals from various components of the machine 100, may operate on the one or more input signals to generate one or more outputs signals (e.g., by executing a program using the input signals as input to the program), and may output the one or more output signals to various components of the machine 100. For example, the engine control system 200 may be electronically connected (e.g., via wired or wireless connection) to one or more sensors 206, to the ignition system 208, to the engine 118, and/or the like, and may receive input from the sensors 206, the ignition system 208, and/or the engine 118.

In some implementations, the engine control system 200 may determine to cause a set of current pulses to be provided in sequence to cause a resonant effect to boost a voltage in a spark plug of the ignition system 208 (e.g., a secondary voltage in a coil of the spark plug). For example, based on timing information from a timing sensor type of sensor 206, current or voltage information from a current or voltage sensor type of sensor 206, and/or the like, the engine control system 200 may determine to trigger a current pulse to cause the resonant effect to boost a voltage in the spark plug, thereby enabling the voltage to satisfy a threshold associated with causing a spark as wear to electrodes of the spark plug increases. In this case, based on the voltage being a negative voltage, the engine control system 200 may boost the voltage by making the voltage more negative to satisfy a negative voltage threshold associated with causing a spark.

Sensors 206 include a set of sensor devices that provide information regarding a state of the machine 100, the engine 118, the ignition system 208, and/or the like. For example, sensors 206 may include a current sensor, a voltage sensor, a timing sensor, an engine status sensor, and/or the like. For example, a timing sensor or position sensor type of sensor 206 disposed on a camshaft, a flywheel, and/or the like may provide information identifying a position of the engine 118, and the engine control system 200 may determine to pulse a current in the ignition system 208 to cause a resonance boosted voltage to cause a spark at a configured time for combustion in a combustion chamber of the engine 118.

Ignition system 208 includes an ignition system to provide a spark for combustion in a combustion chamber of the engine 118. For example, the ignition system 208 may include a primary voltage source to provide a primary voltage, a current driver to provide a current in connection with the primary voltage, a coil to receive the current and provide a secondary voltage with a timing to cause a resonant effect to the secondary voltage, and/or the like.

The number and arrangement of components shown in FIG. 2 are provided as an example. In practice, there may be additional components, fewer components, components, or differently arranged components than those shown in FIG. 2. Furthermore, two or more components shown in FIG. 2 may be implemented within a single component, or a single component shown in FIG. 2 may be implemented as multiple, separate, and/or distributed components. Additionally, or alternatively, a set of components (e.g., one or more components) may perform one or more functions described as being performed by another set of components.

Figure 3:
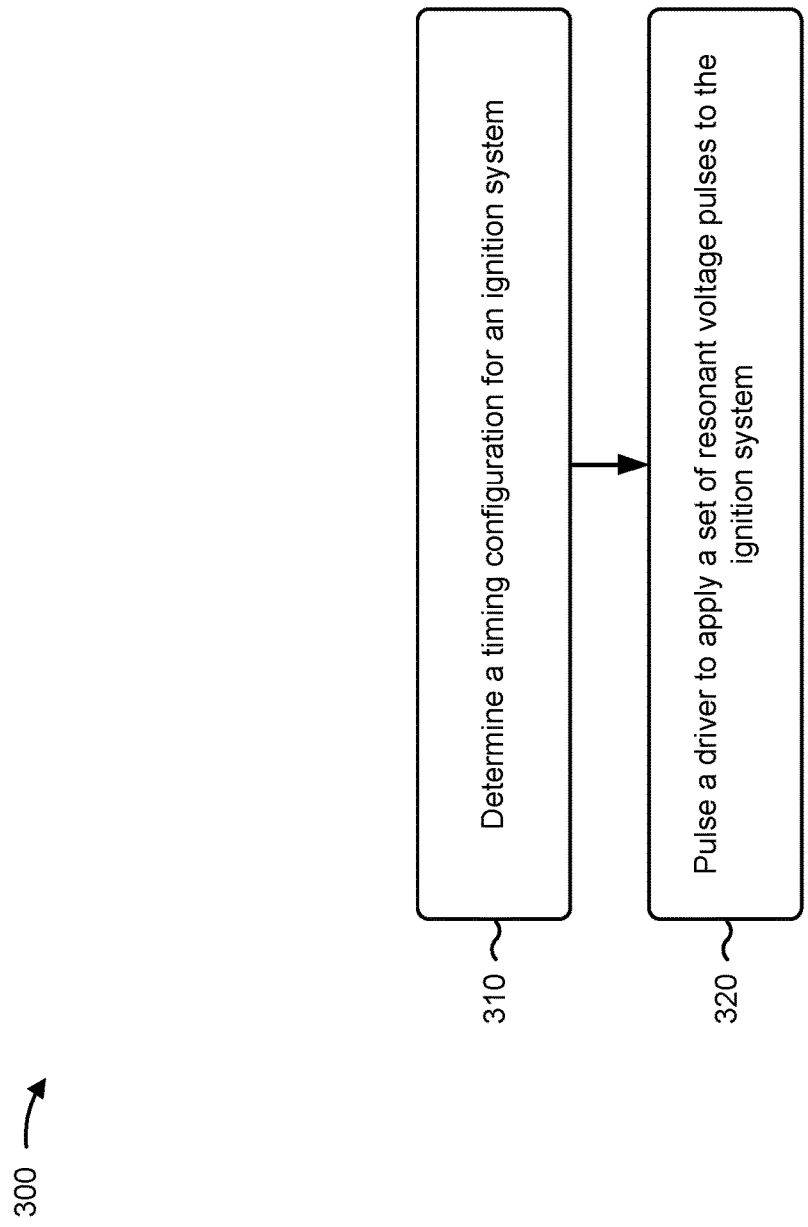
FIG. 3 is a flow chart of an example process for resonance boosted ignition voltage.

FIG. 3 is a flow chart of an example process 300 for control of an ignition system of an engine. In some implementations, process 300 may be performed by the engine control system 200.

As shown in FIG. 3, process 300 may include determining a timing configuration for an ignition system (block 310). For example, the engine control system 200 may determine the timing configuration for the ignition system 208. In some implementations, the engine control system 200 may determine the timing configuration based on a rise time associated with a coil of a spark plug. For example, the engine control system 200 may determine a voltage response of the spark plug in connection with an applied current pulse to determine a timing for applying current pulses to cause a resonance effect.

In some implementations, the voltage response may be a sinusoidal voltage response. For example, the engine control system 200 may determine a sinusoidal voltage response based on stored information or sensor information identifying a state of the ignition system 208, and may determine a set of times (e.g., a first time, a second time, a third time, and/or the like) for triggering a set of current pulses (e.g., a first pulse, a second pulse, a third pulse, and/or the like) to cause a set of resonant voltage pulses. In this case, the engine control system 200 may determine the timing to cause a sinusoidal resonance effect.

In some implementations, the engine control system 200 may determine the timing configuration based on a timing associated with the engine 118. For example, the engine control system 200 may determine a target time at which a spark plug is to cause a spark for the engine 118 based on a timing of the engine 118, and may determine a triggering time, before the target time, to trigger a set of current pulses to cause a voltage pulse to cause a spark at the target time at which the spark plug is to cause the spark.

In some implementations, the engine control system 200 may determine the timing configuration based on a ramp down period and/or a ramp up period. For example, the engine control system 200 may determine a ramp up period and/or a ramp down period of voltage pulses applied to the spark plug of the engine 118, and may determine a threshold period of time for a gap between current pulses to accommodate the ramp up period and/or the ramp down period to enable the resonance effect.

As shown in FIG. 3, process 300 may include pulsing a driver to apply a set of resonant voltage pulses to the ignition system (block 320). For example, the engine control system 200 may pulse the driver to apply the set of resonant voltage pulses to the ignition system 208. In this way, the engine control system 200 increases a maximum voltage achievable for the ignition system 208 relative to applying a single current pulse or a sequence of current pulses out of resonance. For example, the engine control system 200 enables achievement of an increase of approximately 10% to approximately 50% in voltage based on using a resonance boosted voltage relative to using a single current pulse. In this way, the engine control system 200 enables achievement of a spark at a threshold voltage. Further, based on enabling a higher maximum voltage to achieve a spark at a higher threshold voltage, the engine control system 200 enables use of a spark plug with an electrode gap of greater than is achievable with a single voltage pulse and/or a gas density (in the gap) of less than is achievable with a single voltage pulse.

In some implementations, the engine control system 200 may provide an instruction to cause the driver to apply a sequence of current pulses to cause the set of resonant voltage pulses in a spark plug of the ignition system. For example, based on the timing configuration for the ignition system 208, the engine control system 200 may cause the driver to provide a first current pulse to cause a first voltage pulse, a second current pulse to cause a second voltage pulse in resonance with a voltage of electrodes of the spark plug, and/or the like. In this case, based on the voltages being negative voltages, the engine control system 200 may cause the second voltage pulse to occur after a positive voltage peak of a voltage of the spark plug (e.g., when the voltage of the spark plug is decreasing to a lower value) to cause the resonance effect. In some implementations, the engine control system 200 may cause the first pulse and the second pulse to be provided with a particular gap period.

In some implementations, the engine control system 200 may cause different magnitudes of voltage pulses to be provided. For example, the engine control system 200 may cause a first current pulse to cause a first voltage that does not satisfy a threshold for causing a spark, and may cause, after a gap period selected to cause a resonance effect, a second current pulse to cause a second voltage that does satisfy the threshold for causing the spark. In this case, the second voltage may be greater than the first voltage based on the resonance effect associated with the first current pulse and the second current pulse. In some implementations, the engine control system 200 may cause a common current value to be pulsed for the current pulses. In some implementations, the engine control system 200 may cause the first current pulse to be greater than the second current pulse, the second current pulse to be greater than the first current pulse, and/or the like. Additionally, or alternatively, the engine control system 200 may cause a set of current pulses to be associated with a common amount of time, with different amounts of time, and/or the like.

In some implementations, the engine control system 200 may provide a particular quantity of current pulses to cause a particular quantity of voltage pulses to achieve the resonance effect and satisfy a threshold for causing a spark. For example, the engine control system 200 may cause two current pulses, three current pulses, four current pulses, or more current pulses to cause two or more voltage pulses, three or more voltage pulses, four or more voltage pulses, and/or the like.

Although FIG. 3 shows example blocks of process 300, in some implementations, process 300 may include additional blocks, fewer blocks, different blocks, or differently arranged blocks than those depicted in FIG. 3. Additionally, or alternatively, two or more of the blocks of process 300 may be performed in parallel.

Figure 4:
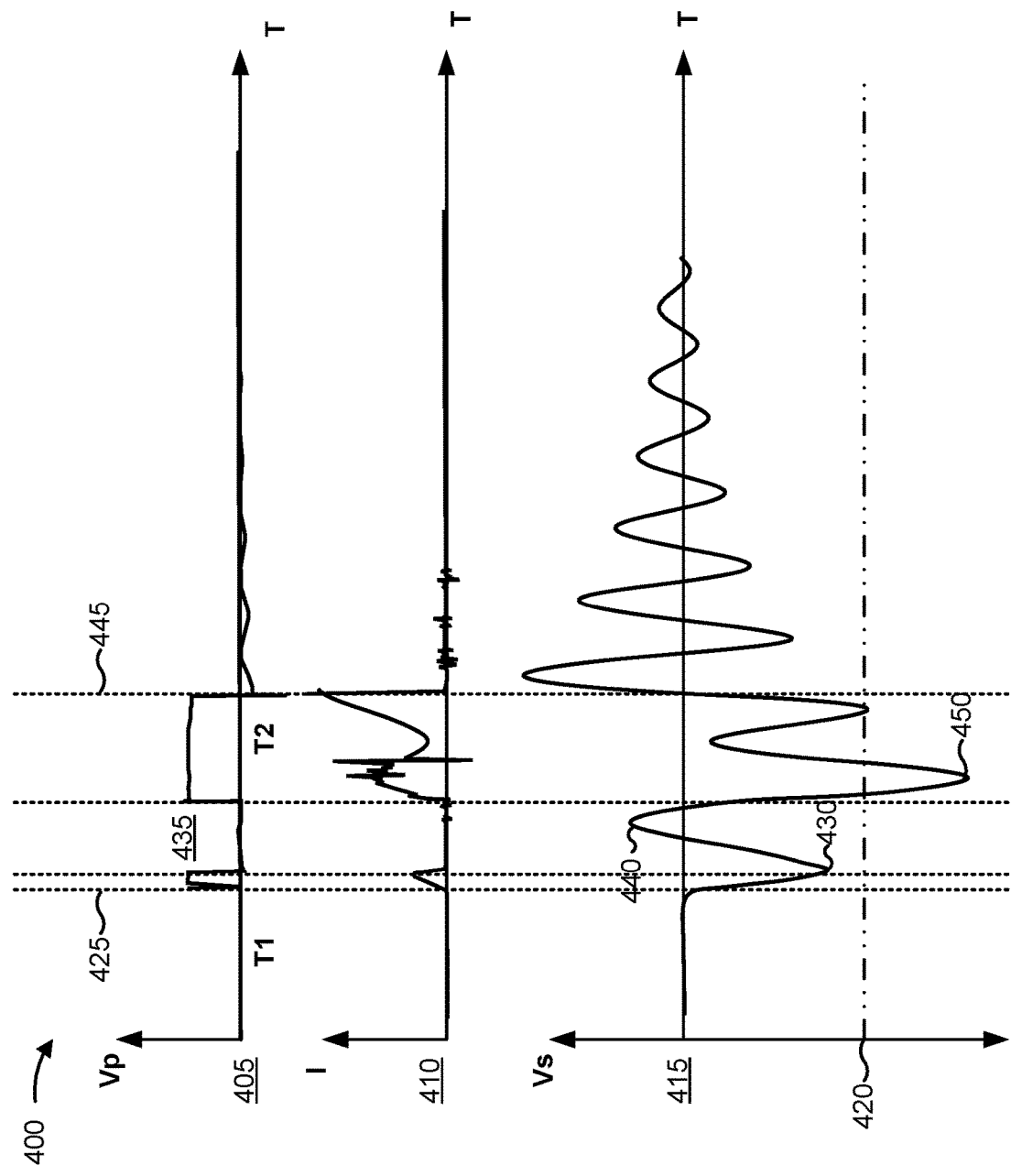
FIG. 4 is a diagram of an example relating to the example process shown in FIG. 3.

FIG. 4 is a diagram of an example 400 of control of an engine. As shown in FIG. 4, a primary voltage, Vp, a current I, and a secondary voltage Vs are shown with respect to time, T, by reference numbers 405, 410, and 415 respectively during an example of operation of the engine control system 200. As shown by reference number 420, a threshold voltage for causing a spark may be illustrated.

As further shown in FIG. 4, and by reference number 425, at a first time, T1, the engine control system 200 may cause a first current pulse to be provided. In some implementations, the engine control system 200 may cause a first primary voltage to be provided to a driver to cause the first current pulse to be provided by the driver to a coil of a spark plug. In some implementations, based on the first current pulse being provided to the coil of the spark plug, a first voltage pulse may be caused in the spark plug, which may achieve a first negative peak, as shown by reference number 430, that does not satisfy the threshold voltage for causing the spark. As shown by reference number 435, a gap period may occur when a current is not provided to the spark plug, resulting in a voltage of the spark plug achieving a positive peak, as shown by reference number 440, based on a sinusoidal variance of the voltage.

As further shown in FIG. 4, and by reference number 445, at a second time, T2, the engine control system 200 may cause a second current pulse to be provided. In this case, the engine control system 200 may cause a second primary voltage to be provided to the driver, which may be the same as the first primary voltage but for a longer duration to cause a greater second current pulse than the first current pulse. Based on the second current pulse being provided when a voltage of the spark plug is decreasing after the positive peak, a resonance effect is caused resulting in a second negative peak, as shown by reference number 450, that satisfies the threshold voltage, thereby causing a spark to be provided for the spark plug.

As indicated above, FIG. 4 is provided as an example. Other examples are possible and may differ from what was described in connection with FIG. 4.

INDUSTRIAL APPLICABILITY

The engine control system 200 may be used with any machine 100 that uses an engine 118. During operation of the machine 100, the engine control system 200 may trigger a set of current pulses in the ignition system 208 timed to cause a resonance effect in a voltage corresponding to the set of current pulses. In this way, the engine control system 200 increases a maximum voltage that may be achieved by the ignition system 208, thereby increasing a maximum gap between electrodes of a spark plug for which the ignition system 208 may cause a spark in the spark plug. In this way, the engine control system 200 improves longevity of a spark plug used for the engine 118 by enabling the spark plug to continue to produce a spark as increasing wear results in an increased gap between electrodes and a corresponding increased voltage requirement for producing the spark.

Thus, implementing a resonance boosted voltage for the engine 118 may improve operation of the machine 100 and/or the engine 118.

As used herein, the articles "a" and "an" are intended to include one or more items, and may be used interchangeably with "one or more." Also, as used herein, the terms "has," "have," "having," or the like are intended to be open-ended terms. Further, the phrase "based on" is intended to mean "based, at least in part, on."

The foregoing disclosure provides illustration and description, but is not intended to be exhaustive or to limit the implementations to the precise form disclosed. Modifications and variations are possible in light of the above disclosure or may be acquired from practice of the implementations. It is intended that the specification be considered as an example only, with a true scope of the disclosure being indicated by the following claims and their equivalents. Even though particular combinations of features are recited in the claims and/or disclosed in the specification, these combinations are not intended to limit the disclosure of possible implementations. Although each dependent claim listed below may directly depend on only one claim, the disclosure of possible implementations includes each dependent claim in combination with every other claim in the claim set.

What is claimed is:

1. A machine, comprising:
   a natural gas engine;
   an ignition system; and
   one or more processors configured to:
      cause a first current to be provided to a coil of the ignition system,
         wherein the first current is configured to cause a first voltage that does not satisfy a threshold voltage to cause a spark in a spark plug of the ignition system; and
      cause, after a gap period, a second current to be provided to the coil of the ignition system to cause the spark in the spark plug of the ignition system,
         wherein the gap period is configured to cause a resonant effect on the first voltage,
         wherein the second current is configured to cause a second voltage that satisfies the threshold voltage based on the resonant effect on the first voltage.

2. The machine of claim 1, wherein the second current is greater than the first current.

3. The machine of claim 1, wherein the first voltage and the second voltage are secondary voltages.

4. The machine of claim 1, wherein the second voltage is a positive voltage; and
   wherein the second current is provided, when a voltage of the ignition system is increasing, to cause a resonant effect.

5. The machine of claim 1, wherein the threshold voltage is greater than approximately 40 kilovolts.

6. The machine of claim 1, wherein the one or more processors are further configured to determine a timing for the gap period based on stored information.

7. The machine of claim 1, further comprising:
a sensor to determine a state of the ignition system.

8. The machine of claim 7, wherein the one or more processors are further configured to determine a timing for the gap period based on measurement information, received from the sensor, identifying the state of the ignition system.

9. The machine of claim 1, wherein the first current is a first current pulse associated with a first amount of time and the second current is a second current pulse associated with a second amount of time, and
wherein the second amount of time is greater than the first amount of time.

10. The machine of claim 1, wherein the resonant effect is a sinusoidal resonance effect.

11. A method comprising:
determining, by a processor, a timing configuration for an ignition system; and
pulsing, by the processor, a driver to apply a set of resonant voltage pulses to the ignition system,
wherein the set of resonant voltage pulses cause a set of increasing peak voltages, and
wherein at least one peak voltage, of the set of increasing peak voltages, satisfies a threshold to cause a spark in a spark plug of the ignition system.

12. The method of claim 11, wherein pulsing the driver comprises:
causing the driver to provide a first current pulse corresponding to a first voltage pulse of the set of resonant voltage pulses;
pausing for a threshold period of time; and
causing the driver to provide a second current pulse corresponding to a second voltage pulse of the set of resonant voltage pulses after pausing for the threshold period of time.

13. The method of claim 12, wherein the second voltage pulse is a negative voltage; and
wherein the second voltage pulse is provided, when a voltage of the ignition system is decreasing, to cause a resonant effect.

14. The method of claim 12, wherein the second voltage pulse causes a voltage of the ignition system to be of a greater magnitude than a maximum voltage achievable by a single current pulse of the driver.

15. The method of claim 11, wherein the set of resonant voltage pulses includes three or more voltage pulses.

16. The method of claim 11, wherein the set of resonant voltage pulses includes four or more voltage pulses.

17. An engine control system, comprising:
a memory; and
one or more processors configured to:
cause a first current to be provided to a coil of an ignition system of an engine at a first time selected based on a first state of the engine,
wherein the first current is configured to cause a first voltage that does not satisfy a threshold voltage to cause a spark in a spark plug of the ignition system; and
cause, after a gap period and at a second time selected based on a second state of the engine and a configuration parameter relating to the first voltage, a second current to be provided to the coil of the ignition system to cause the spark in the spark plug of the ignition system,
wherein the gap period is configured to cause a resonant effect on the first voltage,
wherein the second current is configured to cause a second voltage that satisfies the threshold voltage based on the resonant effect on the first voltage.

18. The engine control system of claim 17, wherein the one or more processors are configured to determine the gap period based at least in part on stored information identifying a timing associated with the resonant effect.

19. The engine control system of claim 17, wherein the first current and the second current are a common current.

20. The engine control system of claim 17, wherein the first current is greater than the second current.

* * * * *